(12) United States Patent
Jang et al.

(10) Patent No.: US 8,604,542 B2
(45) Date of Patent: Dec. 10, 2013

(54) CIRCUIT STRUCTURE WITH CONDUCTIVE AND DEPLETION REGIONS TO FORM TUNABLE CAPACITORS AND RESISTORS

(75) Inventors: Jeng Hsing Jang, Kaohsiung (TW); Yi Nan Chen, Taipei (TW); Hsien Wen Liu, Luzhu Township, Taoyuan County (TW)

(73) Assignee: Nan Ya Technology Corporation, Tao-Yuan, Hsien (TW)

( * ) Notice: Subject to any disclaimer, the term of this patent is extended or adjusted under 35 U.S.C. 154(b) by 135 days.

(21) Appl. No.: 13/215,890

(22) Filed: Aug. 23, 2011

(65) Prior Publication Data
US 2013/0049846 A1 Feb. 28, 2013

(51) Int. Cl.
*H01L 29/78* (2006.01)

(52) U.S. Cl.
USPC .......................................................... 257/330

(58) Field of Classification Search
USPC ........................... 257/330, 355, 334, 347, 532
See application file for complete search history.

(56) References Cited

U.S. PATENT DOCUMENTS

| | | | |
|---|---|---|---|
| 5,801,417 A * | 9/1998 | Tsang et al. .................. | 257/333 |
| 6,979,851 B2 * | 12/2005 | Chidambarrao et al. ..... | 257/301 |
| 8,269,265 B2 * | 9/2012 | Krutsick ....................... | 257/301 |
| 8,362,529 B2 * | 1/2013 | Lin et al. ....................... | 257/288 |
| 8,406,024 B2 * | 3/2013 | Nakamura .................... | 363/131 |
| 2009/0057757 A1 * | 3/2009 | Hokomoto et al. ........... | 257/330 |
| 2010/0078713 A1 * | 4/2010 | Mauder et al. ................ | 257/330 |
| 2010/0140690 A1 * | 6/2010 | Jung ............................. | 257/330 |
| 2010/0219469 A1 * | 9/2010 | Min et al. ...................... | 257/330 |
| 2010/0258856 A1 * | 10/2010 | Hsieh ............................ | 257/328 |
| 2010/0276750 A1 * | 11/2010 | Tu ................................. | 257/330 |
| 2012/0049273 A1 * | 3/2012 | Hirler et al. ................... | 257/330 |
| 2012/0146133 A1 * | 6/2012 | Hirler et al. ................... | 257/330 |

* cited by examiner

*Primary Examiner* — Nathan Ha
(74) *Attorney, Agent, or Firm* — Stites & Harbison PLLC; Juan Carlos A. Marquez, Esq.

(57) ABSTRACT

A circuit structure with a capacitor or a resistor includes a semiconductor substrate, a first conductive region positioned in the semiconductor substrate, a plurality of second conductive regions and third conductive regions positioned in the first conductive region, a first depletion region positioned between the first conductive region and the third conductive region, a second depletion region positioned between the second conductive region and the third conductive region, and a plurality of separating regions positioned in the first conductive region, configured to separate the second and the third conductive regions. In operation, a first voltage is applied to the separating region to control the capacitance or the resistance of the circuit structure. A second voltage is applied to the first conductive region and a third voltage is applied to the second conductive region to measure the capacitance and the resistance of the circuit structure.

3 Claims, 4 Drawing Sheets

CIRCUIT STRUCTURE WITH CONDUCTIVE AND DEPLETION REGIONS TO FORM TUNABLE CAPACITORS AND RESISTORS

BACKGROUND OF THE INVENTION

1. Technical Field

The present invention relates to a circuit structure, and more particularly, to a circuit structure with tunable resistors or capacitors.

2. Background

Demand for mixed-mode integrated circuits (ICs) including data converters, analog-to-digital/digital-to-analog converters, and digital radio chips is rapidly increasing. With the advent of cellular technology and network technology this category now further includes cellular telephone, software radio, LAN, and WAN router ICs. From the fabrication viewpoint, semiconductor process technology has been continually scaling down for the past four decades and the trend continues, where CMOS technology is usually optimal for digital performance and scaling while bipolar transistors are usually optimal for analog performance. However, until the last decade it was difficult to either combine these cost-efficiently or to include both analog and digital in a single design without serious performance compromises. In one aspect, reduced scales of process geometries, combined with the increasing number of resistors and capacitors at each new process node, are forcing the development of a new IC design that fits more circuit elements on fixed or shrinking IC real estate. Conventional capacitors in ICs are parallel plate capacitors, using high dielectric strength materials including $SiO_2$ dry oxide, polysilicon oxide, or $Si_3N_4$ CVD oxide in a variety of electrode combination settings (for example, metal-metal, poly-poly, metal-poly, metal-diffusion, poly-diffusion, etc.). Conventional resistors in ICs are made of strips of resistive layer with contacts and surrounding isolation. To achieve large resistance, the adoption of long strips with large length-to-width ratios is unavoidable. The conventional capacitor and resistors are both based on a planar/horizontal design rule that consumes precious IC real estate. To resolve such issue, a new design concept based on vertically integrated resistors and capacitors is disclosed in the present invention.

SUMMARY

One aspect of the present invention provides a circuit structure with tunable capacitor or a tunable resistor.

A circuit structure according to this aspect of the present invention comprises a semiconductor substrate; a first conductive region positioned in the semiconductor substrate; a plurality of second conductive regions positioned in the first conductive region; a plurality of third conductive regions positioned in the first conductive region and underneath the second conductive regions; a first depletion region positioned between the first conductive region and the third conductive region; a second depletion region positioned between the second conductive region and the third conductive region; and a plurality of separating regions positioned in the first conductive region, with bottoms of the plurality of separating regions in the first conductive region. The separating regions are configured to separate the second and third conductive regions, wherein the first conductive region, the second conductive region, the third conductive region, the first depletion region, the second depletion region, and the separating region form the tunable capacitor or the tunable resistor. A first voltage is applied to the conductor of the separating region to control the capacitance and the resistance of the circuit structure.

A circuit structure according to another aspect of the present invention comprises a semiconductor substrate, a conductive region positioned in the semiconductor substrate, and a plurality of separating regions with a conductor positioned in the conductive region, with bottoms of the plurality of separating regions in the conductive region. The conductive region and the separating regions form the capacitor, and the conductive region and the substrate form the resistor. In operation, a first voltage is applied to the conductor of the separating region to control the capacitance and the resistance of the circuit structure.

The disclosed capacitors and resistors are different from those of the conventional art, in which distinct materials are deposited using extra masks. The present invention leverages ion implantation in the MOS transistor processing technology to achieve vertically integrated RC structure. The new geometry not only reduces the demand for IC real estate, but is also compatible with the standard MOS transistor fabrication routine. Moreover, the application of external bias can further tune the capacitance and resistance of the circuit structure in the present invention.

The foregoing has outlined rather broadly the features of the present invention in order that the detailed description of the invention that follows may be better understood. Additional features of the invention will be described hereinafter, which form the subject of the claims of the invention. It should be appreciated by those skilled in the art that the conception and specific embodiment disclosed may be readily utilized as a basis for modifying or designing other structures or processes for carrying out the purposes of the present invention. It should also be realized by those skilled in the art that such equivalent constructions do not depart from the spirit and scope of the invention as set forth in the appended claims.

BRIEF DESCRIPTION OF THE DRAWINGS

The objectives of the present invention are illustrated with the following description and upon reference to the accompanying drawings in which.

DETAILED DESCRIPTION

Figure 1:
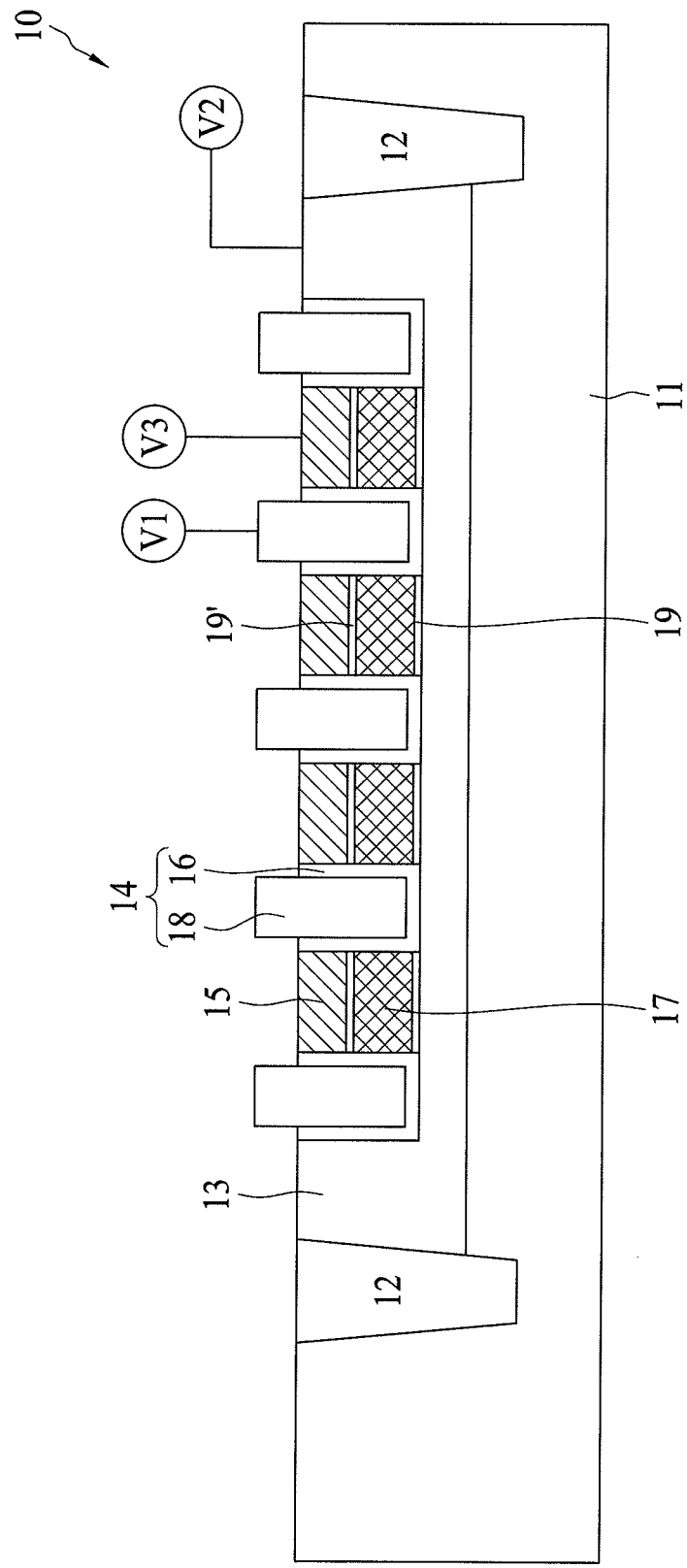
FIG. 1 illustrates a cross-sectional view of a circuit structure configured to implement a tunable capacitor or a tunable resistor according to one embodiment of the present invention.

FIG. 1 illustrates a circuit structure 10 according to one embodiment of the present invention. The circuit structure 10 comprises a semiconductor substrate 11 with shallow trench isolations 12, a first conductive region 13 positioned in the semiconductor substrate 11, a plurality of second conductive regions 15 positioned in the first conductive region, a plurality of third conductive regions 17 positioned in the first conductive region and underneath the second conductive regions 15, and a plurality of separating regions 14 positioned in the first conductive region 13. A first depletion region 19 is positioned between the first conductive region 13 and the third conductive region 17, and a second depletion region 19' is positioned between the second conductive region 15 and the third conductive region 17. The plurality of separating regions 14 is positioned in the first conductive region 13, configured to separate the second conductive regions 15 and the third conductive region 17. In one embodiment of the present invention, each of the separating regions 14 includes a conductor 18 and an insulating layer 16 separating the conductor 18 from the first conductive region 13, the second conductive regions 15, and the third conductive regions 17. In one embodiment of the present invention, the first conductive region 13, the second conductive region 15, the third conductive region 17, the first depletion region 19, the second depletion region 19', and the separation regions 14 form a tunable capacitor. The first conductive region 13 and the second conductive region 15 are diffusion regions comprising doped materials of the same conductive type; the second conductive region 15 and the third conductive region 17 are diffusion regions comprising doped materials of opposite conductive types (for example, one is n-typed semiconductor and the other is p-type semiconductor).

In one embodiment of the present invention, as shown in FIG. 1, the first depletion region 19 is formed between the first conductive region 13 and the third conductive region 17, and the second depletion region 19' is formed between the second conductive region 15 and the third conductive region 17 due to a physical contact between a p-n junction. In steady state, a diffusion current generated by a carrier density gradient is counterbalanced by a drift current generated by space charges which are left behind as a result of carrier diffusion, thereby forming a depletion region free of carriers. The depletion region has a cross-sectional area parallel to the p-n junction interface the size of the cross sectional area of the p-n junction, and a length along the axis perpendicular to the p-n junction interface. The length of the depletion region, or depletion width, dictates the thickness of the capacitor, and can be further controlled by a variable voltage V1 applied to the conductor 18 of the separating regions 14. Three external voltages are applied to different regions of the circuit structure 10 in the present invention:

1) a variable voltage V1 is applied to the conductor 18 of the separating region 14;

2) a fixed operating voltage V2 is applied to the first conductive region 13; and 3) a fixed operating voltage V3 is applied to the second conductive region 15.

Figure 2:
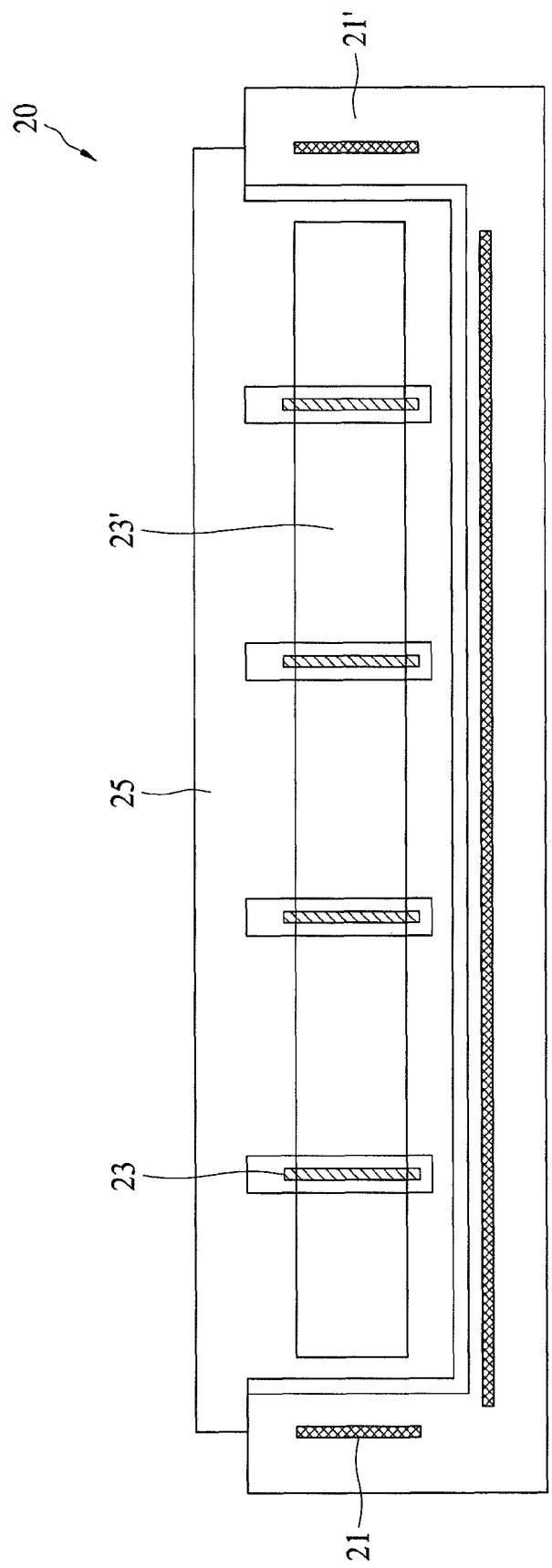
FIG. 2 illustrates a top view of a circuit structure layout configured to implement a tunable capacitor or a tunable resistor according to one embodiment of the present invention.

FIG. 2 illustrates a layout top view 20 of the circuit structure 10 according to one embodiment of the present invention. A first conductive region pick up 21 vertically connects the first conductive region 13 in the direction perpendicular to the paper and toward the viewer to a conductive plate 21' as an external bias contact; a second conductive region pick up 23 vertically connects the second conductive region 15 in the direction perpendicular to the paper and toward the viewer to a conductive plate 23' as another external bias contact; every conductor 18 on the separating region 14 directly contacts the conductive plate 25' as another external bias contact.

As shown in FIG. 2, the two electrodes used to measure the capacitance and the resistance in the circuit structure 10 are a conductive plate 21', to which the V2 is applied, and another conductive plate 23', to which the V3 is applied.

As shown in FIG. 1, according to one embodiment of the present invention, the first conductive region 13 and the second conductive region 15 are comprised of n-doped semiconductor materials, whereas the third conductive region 17 is comprised of p-doped semiconductor materials. When the two fixed operating voltages, V2 and V3, are held at predetermined operating values, the application of the variable voltage V1 will 1) slightly increase the depletion width of the first depletion region 19 and the depletion width of the second depletion region 19', or 2) generate a delta inversion layer containing minority carriers close to the interface between the insulating layer 16 and the third conductive region 17. Depending on the different values and signs of V3 that apply, case 1 or case 2 occurs. The increase in the depletion widths in the first depletion region 19 and the second depletion region 19' causes a capacitance measured between V1 and V2 to decrease, while the generation of the inversion layer directly provides a conductive channel which leads to a resistance decrease. Therefore, according to case 1 and case 2, the capacitance and the resistance of this circuit structure 10 can be tailored by the variable voltage V1.

In one embodiment of the present invention, an alternative method to change the resistance of the circuit structure 10 is to heat the conductor 18 of the separating region 14, for example, applying an external current to the conductor 18 of the separating region 14. The external current, if large enough, can heat up the separating regions 14, so as to excite more mobile carriers in the third conductive region 17 and decrease the resistance of the circuit structure 10. In another embodiment of the present invention, apart from tuning the capacitance and resistance of the circuit structure 10 using external bias, an alteration on the doping profile and doping density during the ion implantation process, a step of the circuit structure 10 manufacturing, enables better resistor and capacitor tuning versatility.

Figure 3:
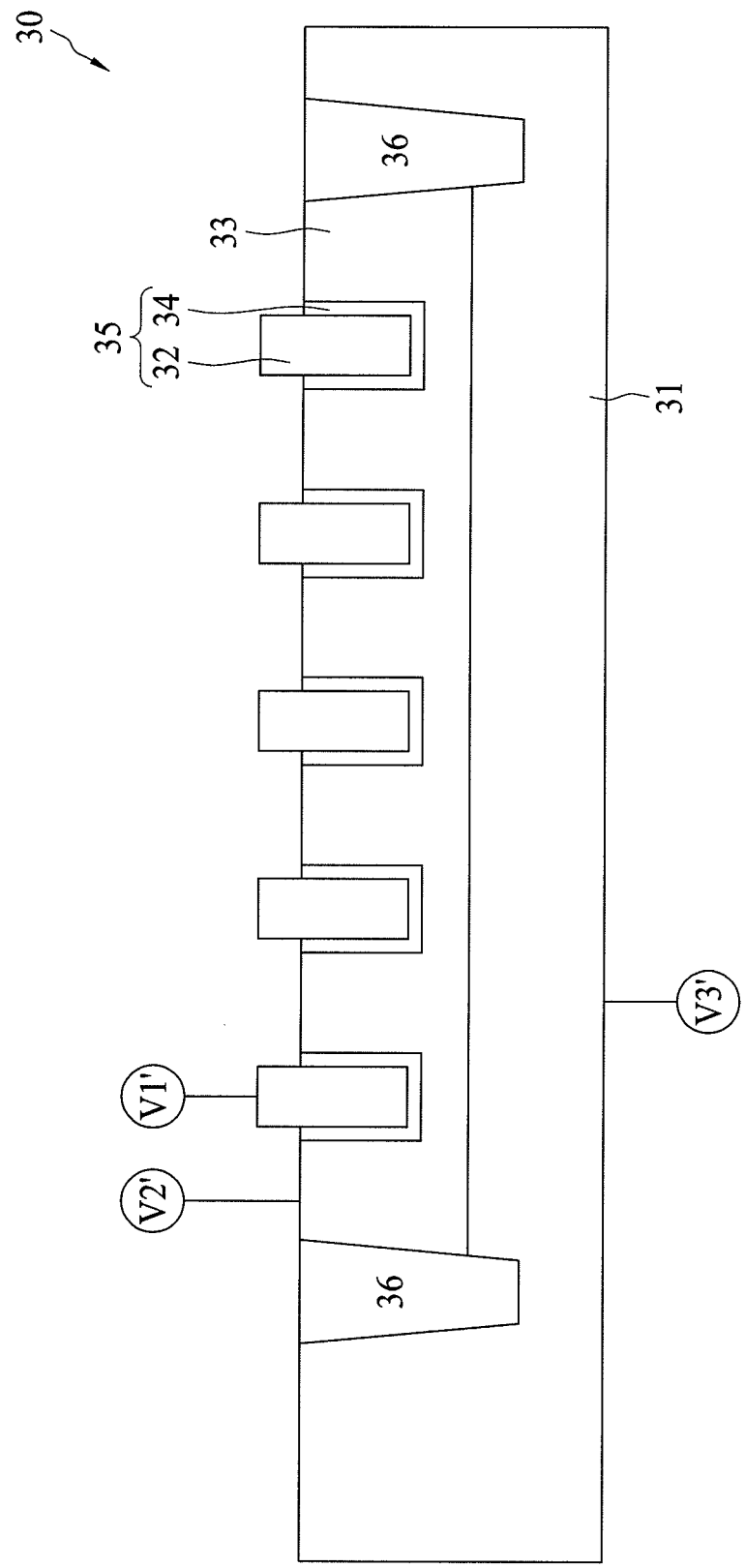
FIG. 3 illustrates a cross-sectional view of a circuit structure configured to implement a capacitor or a resistor according to another embodiment of the present invention.

FIG. 3 illustrates a circuit structure 30 according to one embodiment of the present invention. The circuit structure 30 comprises a semiconductor substrate 31 with shallow trench isolations 36, a conductive region 33, and a plurality of separating regions 35 positioned in the conductive region, with bottoms of the plurality of the separating regions 35 in the conductive region.

The conductive region 33 and the separating regions 35 form a capacitor, and the conductive region 33 and the substrate 31 form a resistor. Each of the separating regions 35 comprises a conductor 32 and an insulating layer 34. The insulating layer 34 is configured to separate the conductive region 33 from the conductors 32.

In FIG. 3, the conductive region 33 is a diffusion region comprising doped materials with one conductive type (for example, n-type or p-type semiconductor). Since only one conductive type exists in the circuit structure 30, no depletion region is formed. Therefore, the insulating layer 34 sandwiched between the conductor 32 and the conductive region 33 resembles a capacitor, that is, a dielectric material positioned between two conductive electrodes. Three external voltages are applied to different regions of the circuit structure 30 in the present invention:

1) a fixed operating voltage V1' is applied to the conductor 32 of the separating region 35;

2) a fixed operating voltage V2' is applied to the conductive region 33; and 3) a voltage V3', which is often grounded, is applied to the substrate 31.

Figure 4:
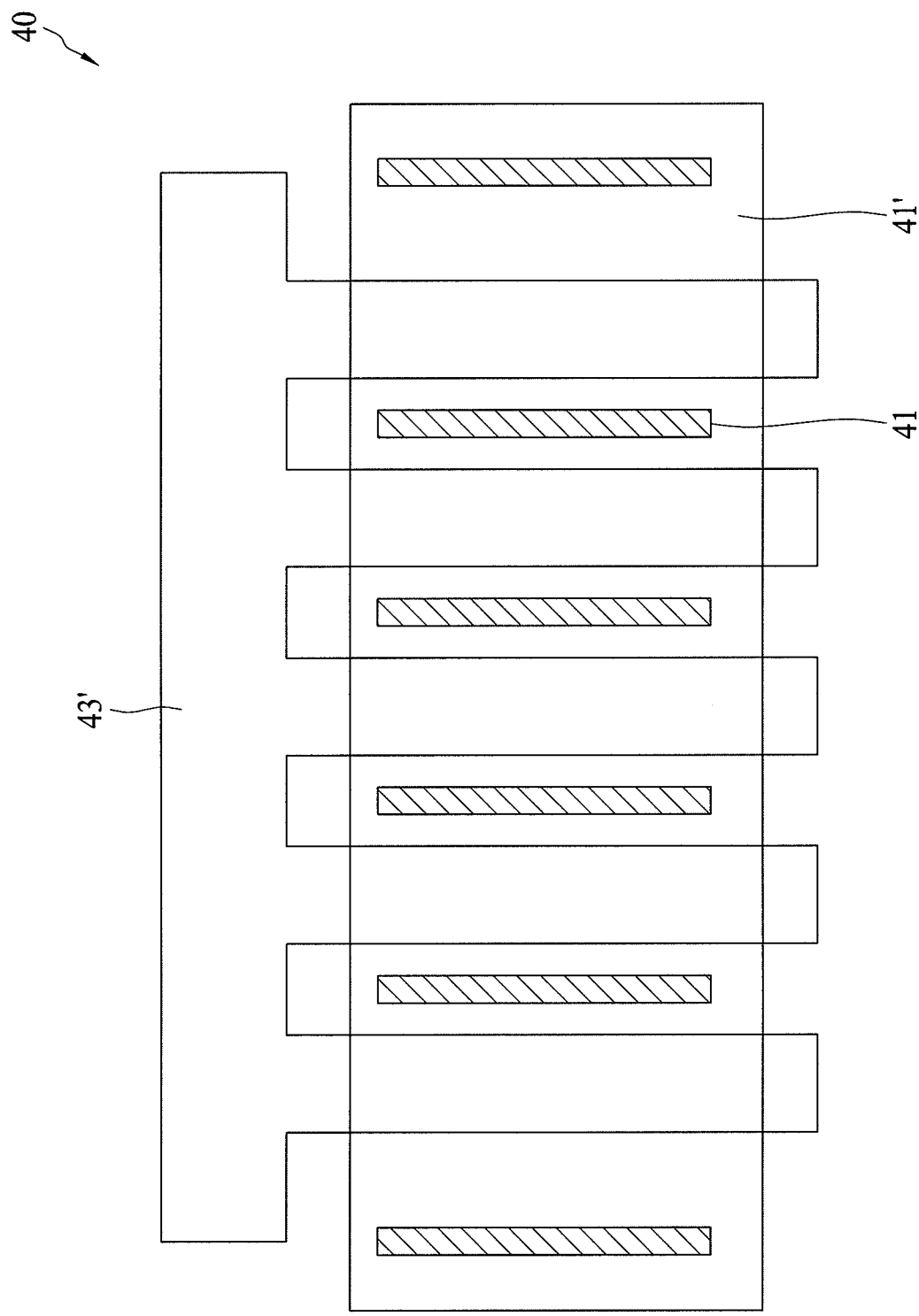
FIG. 4 illustrates a top view of a circuit structure layout configured to implement a capacitor or a resistor according to another embodiment of the present invention.

FIG. 4 illustrates a layout top view 40 of the circuit structure 30 according one embodiment of the present invention. A conductive region pick up 41 vertically connects the conductive region 33 in the direction perpendicular to the paper and toward the viewer to a conductive plate 41' as an external bias contact; every conductor 32 on the separating region 35 directly contacts the conductive plate 43' as another external bias contact.

As shown in FIG. 4, the two electrodes used to measure the capacitance in the circuit structure 30 are a conductive plate 41', to which the V2' is applied, and another conductive plate 43', to which the V1' is applied; the two electrodes used to measure the resistance in the circuit structure 30 are a conductive plate 41', to which the V2' is applied, and the substrate 31, to which the V3' is applied.

Because the circuit structure 30 is not configured to be a tunable device specifically via the control of the external bias, one method of alternating the capacitance and the resistance changes the doping profile or the doping density during the ion implantation process, which is a manufacturing step of the circuit structure 30. From a resistance point of view, for example, under the same external bias, a lightly doped conductive region 33 generates fewer mobile carriers, and thus has a higher resistance, while the heavily doped conductive region 33 generates more mobile carriers, and thus has a lower resistance. From a capacitance point of view, for example, under the same external bias, a lightly doped conductive region 33 effectively generates an additional carrier-free layer in proximity to the insulating layer 34; consequently, a thicker capacitor brings forth a lower capacitance; while no additional carrier-free layer is present in the heavily doped conductive region 33. Therefore, a thinner capacitor has a higher capacitance.

In summary, capacitors and resistors different from those of the conventional art are introduced. The present invention leverages ion implantation in the MOS transistor processing technology to achieve vertically integrated RC structure. The new geometry not only decreases the demand for IC real estate, but is also compatible with the standard fabrication routine. In some embodiments of the present invention, the application of external bias/current can further tune the capacitance and resistance of the RC structure.

Although the present invention and its features have been described in detail, it should be understood that various changes, substitutions, and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit structure, comprising:
a semiconductor substrate;
a first conductive region positioned in the semiconductor substrate;
a plurality of second conductive regions positioned in the first conductive region;
a plurality of third conductive regions positioned in the first conductive region, underneath the plurality of second conductive regions;
a first depletion region positioned between the first conductive region and the third conductive region;
a second depletion region positioned between the second conductive region and the third conductive region; and
a plurality of separating regions positioned in the first conductive region, and configured to separate the second and the third conductive regions;
wherein the first conductive region, the second conductive region, the third conductive region, the first depletion region, the second depletion region, and the separating region form a tunable capacitor or a tunable resistor.

2. The circuit structure of claim 1, wherein each of the separating regions comprises a conductor and an insulating layer, and the insulating layer is configured to separate the second conductive regions and the third conductive regions from the conductor.

3. The circuit structure of claim 1, wherein the first conductive region and the second conductive region are diffusion regions comprising doping materials of a same conductive type, and the second conductive region and the third conductive region are diffusion regions comprising doping materials of opposite conductive types.

* * * * *